(12) United States Patent
Bhat et al.

(10) Patent No.: US 11,374,402 B2
(45) Date of Patent: Jun. 28, 2022

(54) PROTECTION CIRCUIT FOR OSCILLOSCOPE MEASUREMENT CHANNEL

(71) Applicant: Ford Global Technologies, LLC, Dearborn, MI (US)

(72) Inventors: Krishna Prasad Bhat, Canton, MI (US); Chingchi Chen, Ann Arbor, MI (US); Richard William Kautz, Rochester, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 265 days.

(21) Appl. No.: 16/701,649

(22) Filed: Dec. 3, 2019

(65) Prior Publication Data

US 2020/0106265 A1     Apr. 2, 2020

Related U.S. Application Data

(63) Continuation-in-part of application No. 15/469,039, filed on Mar. 24, 2017, now Pat. No. 10,707,673.

(51) Int. Cl.
*H02H 9/04* (2006.01)
*G01R 1/36* (2006.01)

(52) U.S. Cl.
CPC ............... *H02H 9/044* (2013.01); *G01R 1/36* (2013.01)

(58) Field of Classification Search
CPC .......... H02H 3/021; H02H 3/20; H02H 9/044; G01R 1/36; G01R 13/0218
USPC ........................................................ 361/56
See application file for complete search history.

(56) References Cited

U.S. PATENT DOCUMENTS

| 3,750,015 | A |   | 7/1973 | Sheker et al. |
| 4,390,919 | A | * | 6/1983 | Lesinski ................ H01Q 1/50 327/326 |
| 4,437,133 | A |   | 3/1984 | Rueckert |
| 6,373,260 | B1 | * | 4/2002 | Weller ................... G01R 1/067 324/603 |
| 6,885,745 | B1 | * | 4/2005 | Handforth .............. H04M 3/18 379/399.01 |
| 6,970,337 | B2 |   | 11/2005 | Strahm |
| 8,902,557 | B2 |   | 12/2014 | Benner, Jr. |
| 9,167,077 | B2 |   | 10/2015 | Senba |

(Continued)

FOREIGN PATENT DOCUMENTS

DE     112014006170 T5 * 9/2016 ................ H02J 3/46

*Primary Examiner* — Kevin J Comber
(74) *Attorney, Agent, or Firm* — David B. Kelley; Brooks Kushman P.C.

(57) ABSTRACT

Surge protection circuitry includes a pair of series connected diodes sharing a first common terminal that is directly electrically connected to only one of a pair of transmission lines, a pair of series connected Zener diodes, in parallel with the series connected diodes, sharing a second common terminal that is directly electrically connected to only the other of the transmission lines, and a pair of series connected power supplies each configured to reverse bias one of the series connected diodes such that the diodes prevent electrical coupling of the Zener diodes to the transmission lines responsive to a voltage of the signal source being less than a threshold value, and the diodes permit electrical coupling of at least one of the Zener diodes to the transmission lines responsive to the voltage being greater than the threshold value.

18 Claims, 4 Drawing Sheets

(56) References Cited

U.S. PATENT DOCUMENTS

| | | |
|---|---|---|
| 2010/0277839 A1 | 11/2010 | Nicholson et al. |
| 2013/0293992 A1 | 11/2013 | Duvvury |
| 2017/0254842 A1 | 9/2017 | Bahl et al. |
| 2019/0187211 A1* | 6/2019 | Muller .................. G01R 31/54 |

* cited by examiner

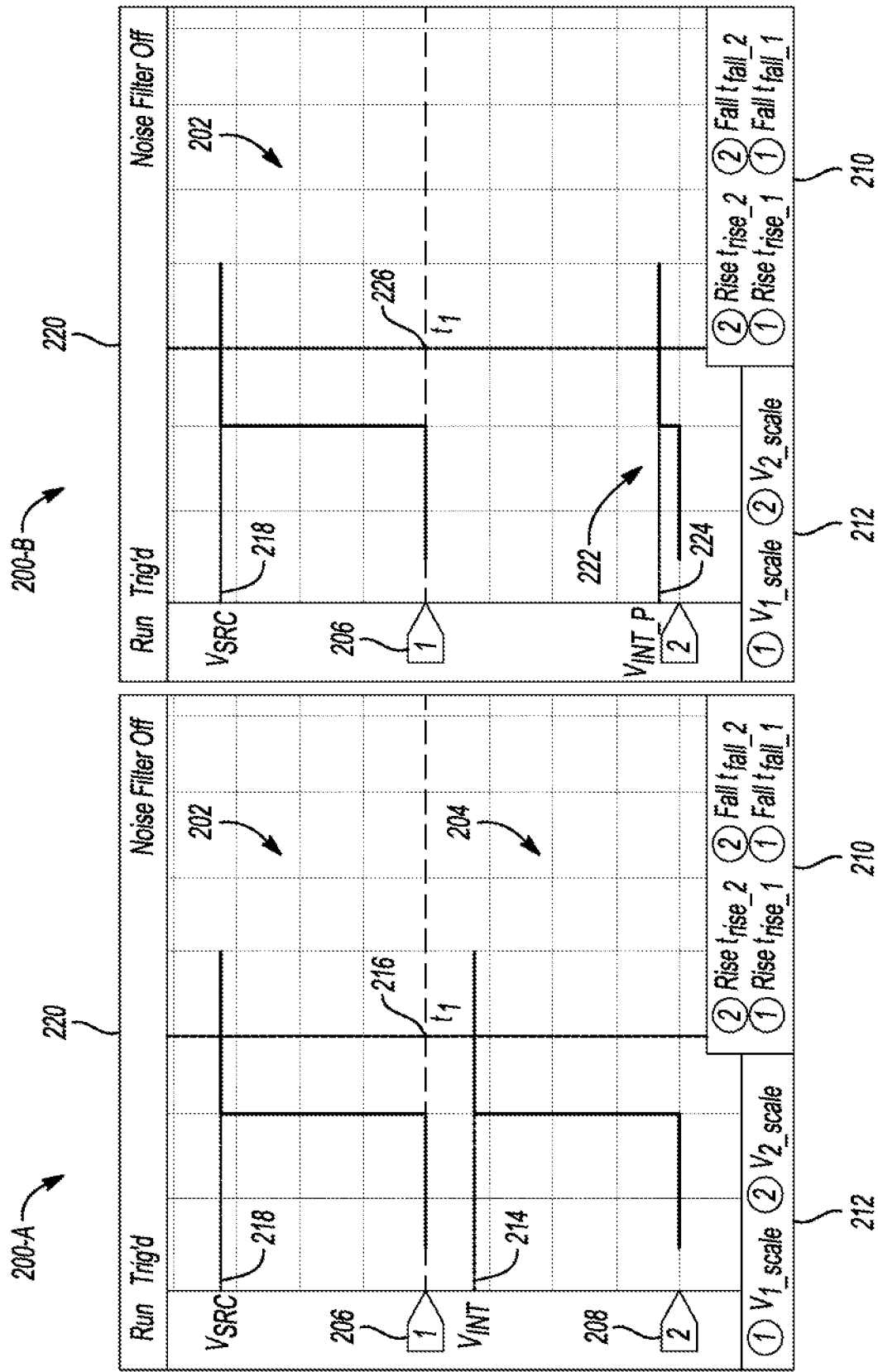

PROTECTION CIRCUIT FOR OSCILLOSCOPE MEASUREMENT CHANNEL

CROSS-REFERENCE TO RELATED APPLICATION

This application is a continuation-in-part of Application Ser. No. 15/469,039, filed Mar. 24, 2017, which is incorporated by reference herein in its entirety.

TECHNICAL FIELD

The present disclosure relates to systems and methods for protecting a measurement channel of an oscilloscope.

BACKGROUND

A digital oscilloscope is a powerful engineering tool for performing digital signal processing and waveform analysis. The oscilloscope may include an analog-to-digital converter, a display, a plurality of user controls, and a processor for performing computations related to a variety of measurements.

The oscilloscope may be computer-based, thus allowing instrument functionality in a software environment. An oscilloscope, accordingly, may be used not only for general measurements, but also for custom measurements, and even as a spectrum analyzer, frequency counter, ultrasonic receiver, or other measuring instrument.

SUMMARY

A surge protection system includes surge protection circuitry configured to be electrically connected with a pair of transmission lines between a signal source and an input to an oscilloscope. The surge protection circuitry includes a pair of series connected diodes in which an anode of one of the diodes shares a first common terminal with a cathode of the other of the diodes. The first common terminal is directly electrically connected to only one of the transmission lines. The surge protection circuitry also includes a pair of series connected energy absorbing elements, in parallel with the series connected diodes, sharing a second common terminal that is directly electrically connected to only the other of the transmission lines. The surge protection circuitry further includes a pair of series connected power supplies each configured to reverse bias one of the series connected diodes such that responsive to a voltage of the signal source being less than a threshold value, the diodes prevent electrical coupling of the energy absorbing elements to the transmission lines, and responsive to the voltage being greater than the threshold value, the diodes permit electrical coupling of at least one of the energy absorbing elements to the transmission lines via flow of current associated with the voltage first through one of the diodes and then to the at least one of the energy absorbing elements. The at least one of the energy absorbing elements absorbs energy associated with the voltage to limit the voltage to a clamp voltage defined by the at least one of the energy absorbing elements. The surge protection circuitry yet further includes a resistor having a first terminal directly electrically connected with the first common terminal and a second terminal directly electrically connected with the second common terminal.

A surge protection system includes surge protection circuitry configured to be electrically connected with a pair of transmission lines between a signal source and an input to an oscilloscope. The surge protection circuitry includes a pair of series connected diodes sharing a first common terminal that is directly electrically connected to only one of the transmission lines, a pair of series connected Zener diodes, in parallel with the series connected diodes, sharing a second common terminal that is directly electrically connected to only the other of the transmission lines, and a pair of series connected power supplies each configured to reverse bias one of the series connected diodes such that the diodes prevent electrical coupling of the Zener diodes to the transmission lines responsive to a voltage of the signal source being less than a threshold value, and the diodes permit electrical coupling of at least one of the Zener diodes to the transmission lines responsive to the voltage being greater than the threshold value.

A surge protection system includes surge protection circuitry configured to be electrically connected with a pair of transmission lines between a signal source and an input to an oscilloscope. The surge protection circuitry includes a pair of series connected diodes sharing a first common terminal that is directly electrically connected to only one of the transmission lines, a pair of series connected Zener diodes, in parallel with the series connected diodes, sharing a second common terminal that is directly electrically connected to only the other of the transmission lines, and a pair of series connected power supplies each configured to reverse bias one of the series connected diodes such that the diodes prevent electrical coupling of the Zener diodes to the transmission lines responsive to a voltage of the signal source being less than a threshold value, and the diodes permit electrical coupling of at least one of the Zener diodes to the transmission lines responsive to the voltage being greater than the threshold value. The surge protection circuitry further includes a switch electrically connected between the surge protection circuitry and the signal source, and a control circuit configured to command the switch to open responsive to a measured parameter exceeding a reference value.

BRIEF DESCRIPTION OF THE DRAWINGS

FIGS. 4A and 4B are graphs illustrating voltage signal waveforms; and

DETAILED DESCRIPTION

Figure 1:
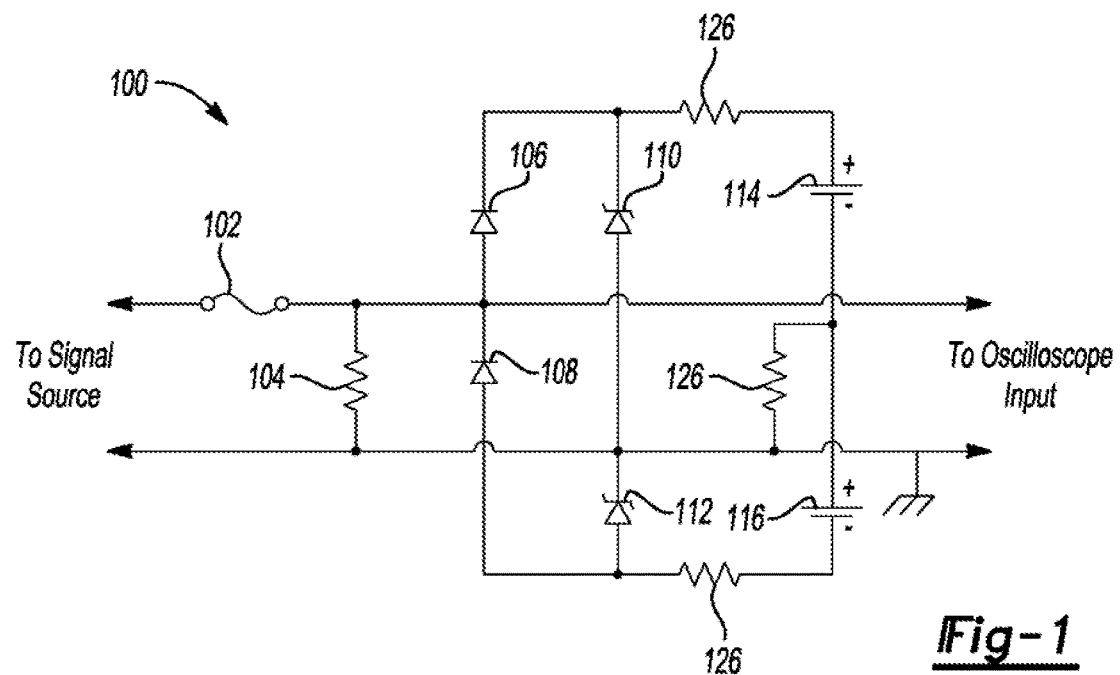
FIG. 1 is a schematic diagram illustrating an example circuit for protecting an input channel of an oscilloscope.

Embodiments of the present disclosure are described herein, it is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Power electronics testing and other projects may necessitate the use of instruments configured to measure high frequency and/or high bandwidth signals. Bandwidth describes a frequency range of an input signal that may pass through the analog front end with a minimal amplitude loss from the tip of the probe or test fixture to the input of the analog-to-digital converter of the oscilloscope. Bandwidth may be defined as a frequency f at which a sinusoidal input signal is attenuated to 70.7 percent of its original amplitude, also known as the −3 dB point. The signals composed of high-frequency content may include sharp edges or other features of interest to the oscilloscope user. As one example, a 10 MHZ square wave is composed of a 10 MHz sine wave and an infinite number of its harmonics. To accurately capture a shape of this signal, the bandwidth of the oscilloscope should be large enough to capture several of these harmonics.

General use measurement equipment may not be able to accommodate measurement of signals having one or both a high magnitude and a large high frequency content without risking exposing the equipment components to currents and voltages that exceed their specifications. To observe and/or analyze an input signal having both a high current/voltage magnitude, such as, but not limited to, between 20 amperes (A) and 10 kA, and a high frequency profile, such as frequencies greater than 50 megahertz (MHz), one or more current shunt resistors may be used with the oscilloscope signal circuit. A current shunt resistor may define a low impedance resistor having minimal effect on the circuit and producing a relatively small parasitic inductance, thus permitting measurements of current signal profiles having higher bandwidth, or frequency range.

An input terminal, or input channel, of a typical oscilloscope may be configured to receive a signal transmission cable. In one example, the transmission cable, also referred to as transmission line, may define a coaxial cable including a probe at a first end and a radio frequency connector, e.g., a connector including a pair of bayonet lugs, at a second end. In some examples, the probe may comprise a probe head configured to receive a spring or rigid probe tip and a blade or offset ground tip. Attaching (or otherwise positioning) the probe tip in proximity with a signal source may enable the output signal of the source to be observed, measured, and analyzed using the oscilloscope. In some other examples, the probe may comprise a clamp configured to receive one or more coils of a wire in which the signal is being measured.

The probe may define, for example, a passive probe including one or more passive circuit components and having relatively low bandwidth. In another example, the probe may define a divider or attenuating probe including an integrated resistor and capacitor connected in parallel. In still another example, the probe may be an active probe defining a low input capacitance necessary for measuring high frequency signals or isolating the measurement from a particular ground reference. In yet another example, the probe may comprise one of a differential probe used with a differential or floating input of the oscilloscope, a high voltage active probe for measuring high direct current (DC) offsets or large voltage ranges, or a current probe including at least one of a Hall effect sensor and a current transformer and configured to convert the detected current flow to voltage that may be viewed and measured using the oscilloscope. Other probe types and configurations, as well as probes defining additional or wholly divergent capabilities, are also contemplated.

The connector at the second end of the transmission cable may be configured to connect to at least one input channel of the oscilloscope. The effect of the probe or probe components on the signal may, accordingly, distort the signal received at the oscilloscope. The input resistance, capacitance, bandwidth, and other specifications and operating characteristics of a given probe may affect the signal the probe is transmitting to the oscilloscope.

As one example, the impedance of the circuit and the input impedance of the oscilloscope together may define a low-pass filter. For very low frequencies, the capacitor may act as an open circuit, thereby, having little or no effect on the measurement. For high frequencies, the capacitor's impedance may become significant and may load down the voltage seen by the oscilloscope, such as may be observed in the frequency domain. If the input is a sine wave, the amplitude may decrease with increasing frequency and the phase may be shifted. The loading may also affect the oscilloscope's response to a step change in voltage. The loading due to the input impedance of the scope (and the probe capacitance) may be one or more of resistive loading and capacitive loading. The resistive loading may be due to the input resistance of the scope, while the capacitive loading may be due to the probe capacitance combined with the scope input capacitance.

The resistive loading may be illustrated using a voltage divider circuit, such that the voltage delivered to the scope input, $V_{IN}$ may include a source voltage, $V_S$ having a reduced amplitude. As an example, the input voltage over time, t for a given maximum voltage, $V_{MAX}$ may be given as shown in Equation (1):

$$V_{IN}(t) = V_{MAX} \frac{R_{IN}}{R_{IN} + R_S} \qquad (1)$$

The effect of capacitive loading may be more complex and may result in an exponential response in the input voltage $V_{IN}$. The input voltage, $V_{IN}$ may be a product of a voltage step having a value that increases from zero volts to the maximum voltage, $V_{MAX}$ over time, t and may be given as shown in Equation (2).

$$V_{IN}(t) = V_{MAX}(1 - e^{-t/(R_S C_T)}), \qquad (2)$$

where $R_S C_T$ defines a time constant, $\tau$.

The resistive loading may change the size of the voltage step, but does not change the waveform Shape. Capacitive loading may slow down the rise time of the step but may eventually settle out to a same final value as an ideal frequency response. The bandwidth may be inversely proportional to rise time of a system, such that a decrease in the bandwidth of the measuring instrument may cause a corresponding increase in the rise and fall times of pulse inputs to the instrument.

The output resistance (drive capability) of a digital circuit may vary with the output voltage, thus, causing a variation in the effect of capacitive loading. Nevertheless, the load capacitance may slow down the rise time of the signal while resistive loading may affect the output amplitude. Increased rise time in a digital circuit may, thereby, cause an increased delay before the signal reaches the next logic gate. This may be due to increased signal rise time to the logic threshold, causing the next gate to switch later. Therefore, where the input impedance of a given oscilloscope may be large enough to prevent or minimize effects of resistive loading, a given circuit may, nevertheless, be vulnerable to capacitive loading due to an increased signal rise time introduced by the probe.

The additional capacitance of the probe may further cause the resonance frequency of an LC circuit to change. In one example, additional capacitance introduced by the probe may change the resonance frequency of the LC circuit to 0.93 times its original frequency and may, thus, prevent a correct operation of that circuit while the measurement is being taken with the probe.

Active probes may be ideal in cases where extremely low capacitance is required for high-frequency measurements or a measurement needs isolation from a given ground reference. The integrated active amplifier of the active probe may enable the probe to have very little capacitance on its input, such as a value less than or equal to 2 picofarads (pF). Furthermore, the output impedance of the amplifier may be matched to an impedance of the oscilloscope input, thereby minimizing any additional capacitive loading effects. The low capacitance of the active probe may result in high input impedance at high frequencies.

The signal transmission cable may have a predefined impedance, such as, but not limited to, 50Ω. The use of current shunts may require the use of 50-Ω transmission cable, which may be connected either directly to the oscilloscope signal input terminal, or via an input terminal external to the oscilloscope that is then connected to the oscilloscope's 1 MΩ input terminal. This setup brings risk, where an excessive current surge, and/or blow-out of the current shunt can cause an excessive voltage surge on the measurement line.

FIG. 1 illustrates an example protection circuit 100 configured to protect an oscilloscope, or another measuring instrument, from electrical issues that may result due to transmission line voltage being greater than a predefined threshold. The circuit 100 includes a fuse 102. As one example, the fuse 102 may be a disposable fuse. As another example, the fuse 102 may be a resettable fuse.

The circuit 100 may include a resistor 104 connected in parallel between the signal source and the oscilloscope. The resistor 104 may be an impedance matching resistor configured to regulate transmission line impedance to match an impedance value at the input terminal of the oscilloscope.

The circuit 100 further includes diodes 106, 108 each being configured to couple and decouple a corresponding one of first and second energy absorbing elements 110, 112, respectively, such that the corresponding impedances of the elements 110, 112 become perceptible/imperceptible to the transmission line, as the case may be, and/or the measuring equipment. In this example, the anode of the diode 106 is connected to the cathode of the diode 108. Additionally, the diodes 106, 108 may each be biased by respective power supplies 114, 116. The values of the power supplies 114, 116 may be defined such that the corresponding diodes 106, 108 are reverse biased in response to line voltage $V_{line}$ being less than a voltage value of a corresponding one of the power supplies 114, 116 and are forward biased in response to line voltage ii e being greater than the voltage value of the corresponding one of the power supplies 114, 116.

As one example, the diode 106 may be reverse biased in response to the line voltage $V_{line}$ being less than the value of the power supply 114. When in reverse biased state, the diode 106 may, thereby, decouple an impedance of the energy absorbing element 110 and other elements of the circuit 100 from the transmission line.

Furthermore, the diode 106 may be forward biased in response to the line voltage being greater than the value of the power supply 114. When in a forward biased state, the diode 106 may direct energy to the energy absorbing element 110 in response to line voltage $V_{line}$ being greater than the clamp voltage $V_{clamp+}$ of the energy absorbing element 110. The diode 106 may, thereby, couple an impedance of the energy absorbing element 110 and other elements of the circuit 100 to the transmission line. The energy surge may, accordingly, pass through the energy absorbing element 110, thereby clamping, e.g., limiting, the line voltage $V_{line}$ at a value approximately equal to the clamp voltage $V_{clamp+}$ of the energy absorbing element 110.

The circuit 100 may be element symmetric, such that the diode 108 may be configured to operate with respect to the negative voltage values in a similar manner to the operation of the diode 106 with respect to the positive voltage values. For example, the diode 108 may be reverse biased in response to the negative line voltage $V_{line}$ being less than the value of the power supply 116. When in a reverse biased state, the diode 108 may decouple are impedance of the energy absorbing element 112 and other elements of the circuit 100 from the transmission line.

Furthermore, the diode 108 may be forward biased in response to the negative line voltage $V_{line}$ being greater than the value of the power supply 116. When in a forward biased state, the diode 108 may direct energy to the energy absorbing element 112 in response to the line voltage $V_{line}$ being greater than the clamp voltage $V_{clamp-}$ of the energy absorbing element 112. The diode 108 may couple an impedance of the energy absorbing element 112 and other elements of the circuit 100 to the transmission line. The energy surge may, accordingly, pass through the energy absorbing element 112, thereby clamping, e.g., limiting, the line voltage $V_{line}$ at a value approximately equal to the clamp voltage $V_{clamp-}$ of the energy absorbing element 112.

The energy absorbing elements 110, 112 may be Zener diodes defining a breakdown voltage, or the amount of reverse voltage which the diode receives, before it breaks down and begins conducting reverse current across its junctions. Thus, the energy absorbing elements 110, 112 may conduct current in a reverse biased direction across its terminals in response to the line voltage $V_{line}$ being greater than the corresponding breakdown voltages of each of the energy absorbing elements 110, 112. Prior to the breakdown voltage of the energy absorbing elements 110, 112 being exceeded, the energy absorbing elements 110, 112 may be configured to hold voltage across their terminals to the value of the line voltage $V_{line}$.

A plurality of resistors 126 may be configured to act as low frequency decoupling elements to decouple the power supplies 110, 112 from the high frequency transmission line.

The circuit 100 may be configured to provide protection against voltage spikes as high as 1000 VDC, while maintaining oscilloscope operating requirements, such as, but not limited to, transmission line termination impedance of 50Ω, output voltage having a value significantly less than a maximum voltage specified for the equipment, e.g., output voltage ~±20 V for equipment specified voltage ±325 V, operate at a bandwidth (50 MHz) greater than current shunt (10-20 MHZ), minimal intrusion effect on transmission line (<1% error), and prevent or minimize electrical arcing between output of the signal source and the input terminal of the oscilloscope during fault interruption.

As an example, the protection circuit 100 may be implemented on a four-layer printed circuit board (PCB) (not shown). The top layer of PCB may be dedicated mainly for high frequency measurement transmission line, a transmission fuse element, and to ensure impedance matching between impedance of the transmission line and impedance at the input to the oscilloscope. The PCB implementation of the protection circuit may be configured to include one or more traces having minimal width sufficient to support serving as a transmission line and ensure effective 50-Ω transmission line impedance compatible with the 50-Ω impedance at the input to the oscilloscope.

A bottom layer of the PCB may include a plurality of protection components such as, but not limited to, one or more series diodes, suppression diodes, and so on. The protection components may be configured to absorb excess energy. In some examples, a signal ground line may define a return path for current. A power ground may be left unused to reduce impact of possible ground currents. Physical presence of power ground may be helpful due to 4-layer PCB design.

Figure 2A:
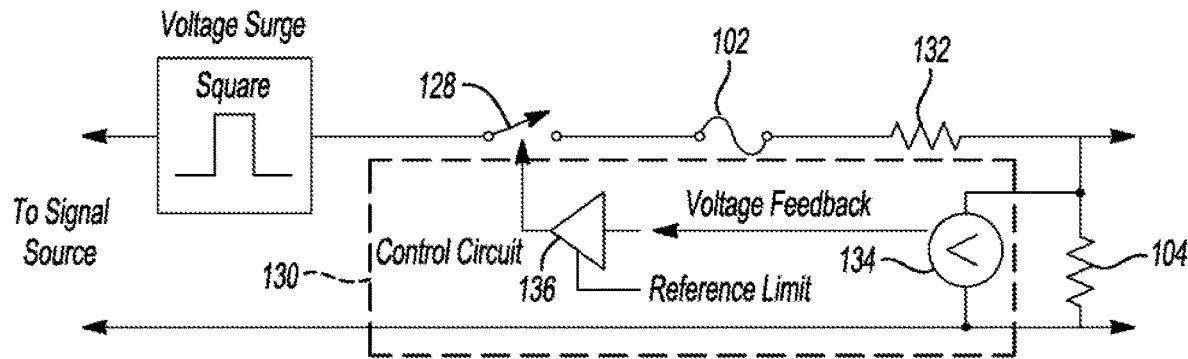
FIGS. 2A, 2B, and 2C are schematic diagrams of a portion of the example circuit of FIG. 1 and additional circuitry.
Figure 2B:
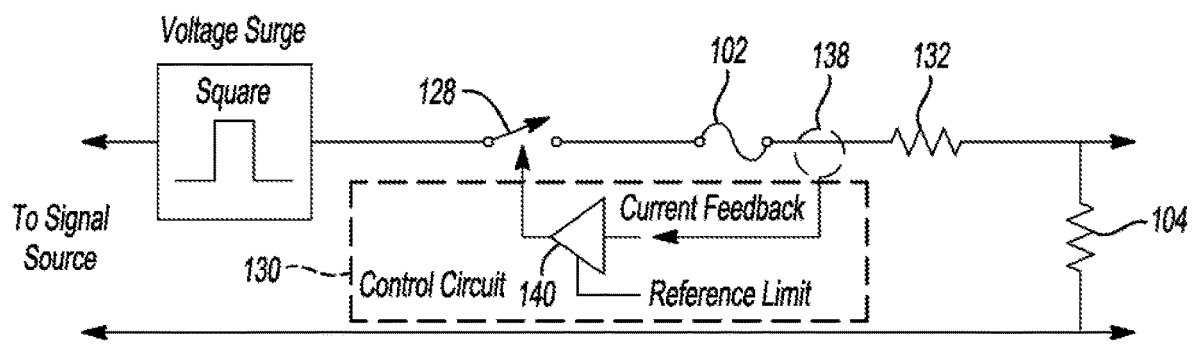
Figure 2C:
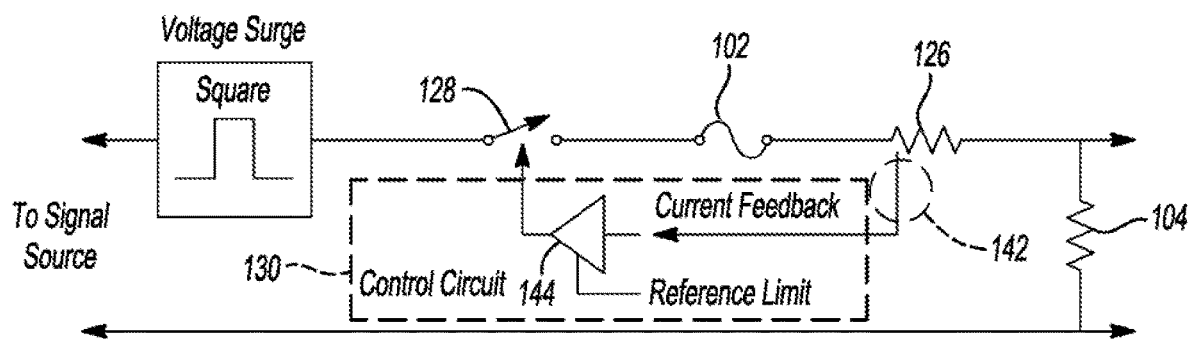

FIGS. 2A, 2B, and 2C illustrate a switch 128 (e.g., a relay), control circuitry 130, and resistor 132 that may be used in combination with the protection circuit 100. The switch 128 is electrically connected between the signal source and the fuse 102, and the resistor 132 is electrically connected between the fuse 102 and the resistor 104 such that the switch 128, fuse 102, and resistor 132 are in series.

In the example of FIG. 2A, the control circuitry 130 includes a voltage sensor 134 arranged to detect a voltage across the resistor 104 and a comparator 136 arranged to compare the voltage across the resistor 104 to a reference value. Responsive to the voltage across the resistor 104 exceeding the reference value, a command is issued to open the switch 128. Otherwise, the switch 128 remains closed. The reference value may depend on test set up, and may be determined via simulation, testing, etc.

In the example of FIG. 2B, the control circuitry 130 includes a current sensor 138 (magnetic Hall effect sensor) arranged to detect a current on the transmission line between the fuse 102 and resistor 132, and a comparator 140 arranged to compare the current to a reference value. Responsive to the current exceeding the reference value, a command is issued to open the switch 128. Otherwise, the switch 128 remains closed.

In the example of FIG. 2C the control circuitry 130 includes a current sensor 142 arranged to detect a current through the resistor 132, and a comparator 144 arranged to compare the current to a reference value. Responsive to the current exceeding the reference value, a command is issued to open the switch 128. Otherwise, the switch 128 remains closed. The control circuitry 130 may issue the commands as described or controllers contemplated herein may issue the commands. Other alternatives are also possible.

Figure 3:
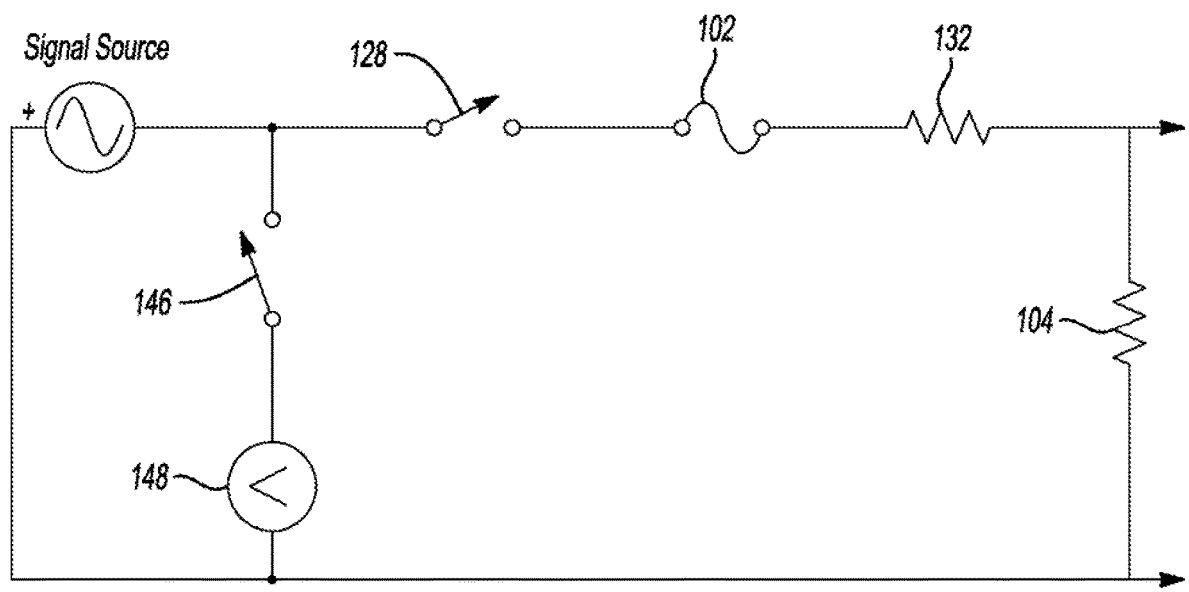
FIG. 3 is a schematic diagram of another portion of the example circuit of FIG. 1 and additional circuitry.

FIG. 3 illustrates a switch 146 (e.g., a relay) and voltage sensor 148 that may be used in combination with the protection circuit 100 and any of the other circuitry described herein (such as the control circuitry 130 of FIGS. 2A, 2B, and 2C. The switch 146 and voltage sensor 148 are connected in series between the transmission lines, and between the signal source and the switch 128. As such, responsive to the switch 146 being closed, the voltage sensor 148 may detect the voltage of the signal source. If the voltage exceeds a predetermined limit, an alert may be generated to instruct a user not to close the switch 128. That is, one may check to ensure the voltage of the signal source falls within an acceptable range prior to the switch 128 being closed.

FIGS. 4A and 4B illustrate example diagrams 200-A and 200-B of a source signal 202, as detected, for example, by positioning a first probe in proximity with a signal source, and an input terminal signal 204, as detected, for example, by positioning a second probe in proximity with an input terminal of an oscilloscope, or another measuring instrument, connected with the same signal source. The input terminal signal 204, i.e., the signal received by the measuring instrument connected to the signal source from which the signal 202 originated, may therefore, be indicative of an effect the source signal 202 may have on the instrument receiving the signal 202.

The profiles of the signals 202, 204 may be displayed, for example, on first and second input channels 206, 208, respectively. The signals 202, 204 may be voltage signals, each having same or different rise and fall times 210 and being shown according to the same or different signal display scale 212, e.g., a predefined display scale selected by the user. One or more additional settings 220 may be applied to view, display, or analyze the signals 202, 204.

As one example, the measuring instrument whose input terminal signal 204 is shown in FIG. 4A may be the instrument not equipped with the protection circuit, such as the example circuit 100 described with reference to FIG. 1. An input terminal voltage $V_{INT}$ 214 detected at time $t_1$ 216 at the input terminal of the unprotected measuring instrument may be indicative of a source voltage $V_{SRC}$ 218 detected at the time $t_1$ 216 at the signal source. More specifically, given that the corresponding signal display scales 212 are the same for both signals 202, 204, e.g., $V_{1\_scale}=V_{2\_scale}$, the input terminal voltage $V_{INT}$ 214 may be approximately equal to the source voltage $V_{SRC}$ 218, as shown in FIG. 4A. Where the source voltage $V_{SRC}$ 218 is greater than a maximum operating voltage of the instrument, the operation of the input terminal and/or of the measuring instrument itself may be negatively affected.

As another example, the measuring instrument whose input terminal signal 222 is shown in FIG. 4B may include a protection circuit, such as the example circuit 100 described with reference to FIG. 1. A protected input terminal voltage $V_{INT\_P}$ 224 detected at time $t_1$ 226 at the input terminal of the protected measuring instrument may be indicative of a value much less than the source voltage $V_{SRC}$ 218 detected at the time $t_1$ 226 at the signal source.

More specifically, the instrument may be equipped with the protection circuit 100 that includes the diodes 106, 108 biased by the voltage supplies 114, 116, respectively, and further includes the energy absorbing elements 110, 112 having a predefined breakdown voltage $V_{BRK}$. The protection circuit 100 may be configured to enable the diodes 106, 108 to conduct (or become forward-biased) responsive to voltage at the input to the protection circuit being greater than voltage of the corresponding one of the voltage supplies 114, 116.

The protection circuit 100 may, thereby, couple the impedance of the circuit 100 to the transmission line leading to the input terminal of the measuring instrument. The protection circuit 100 may, accordingly, cause the corresponding one of the energy absorbing elements 110, 112 to absorb, redirect, and/or dissipate energy in excess of the predefined breakdown voltage $V_{BRK}$ of that element. The protected input terminal voltage $V_{INT\_P}$ 224 of the measuring instrument that includes the protection circuit 100 may, therefore, be approximately equal to the predefined breakdown voltage $V_{BRK}$ of one of the elements 110, 112.

Figure 5:
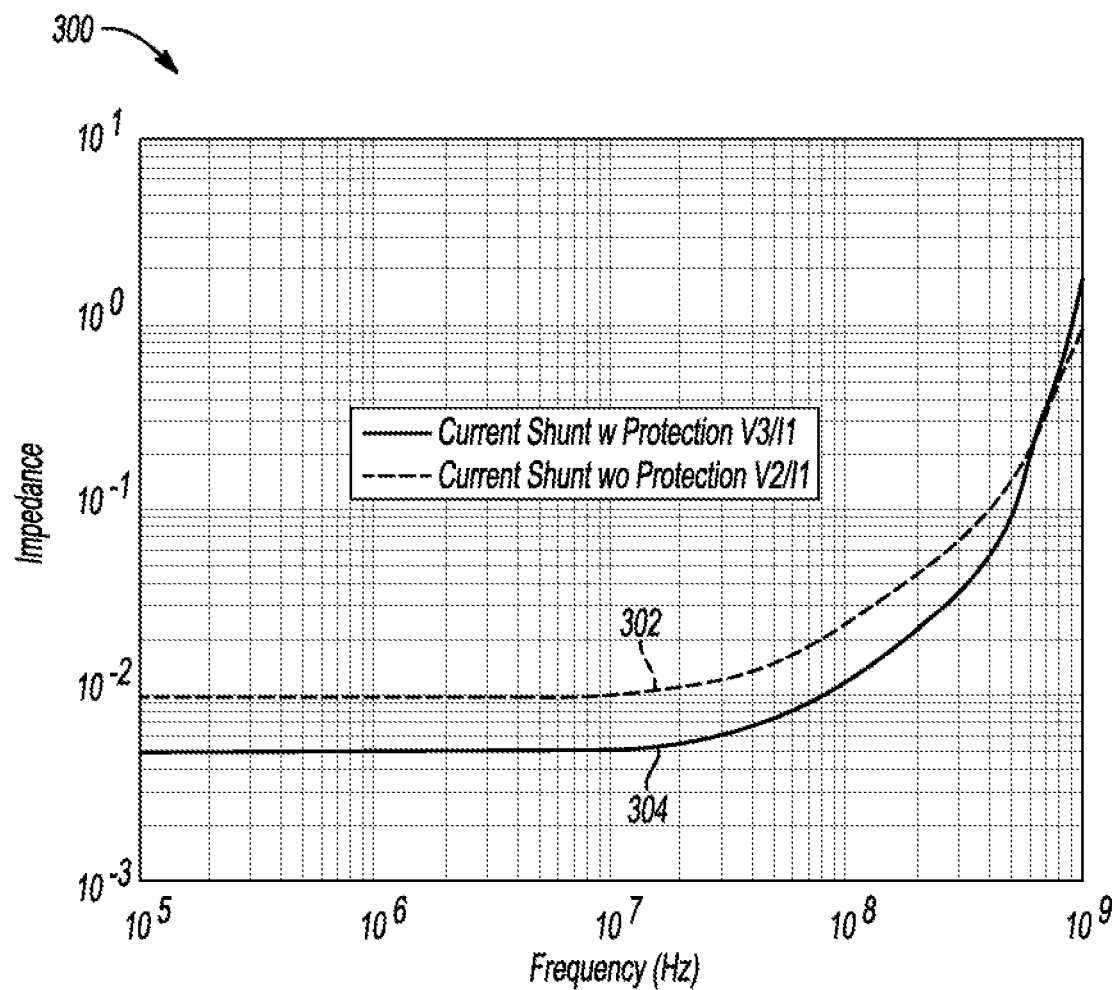
FIG. 5 is a graph illustrating transmission line impedance waveforms.

FIG. 5 illustrates an example graph 300 illustrating a change in transmission line impedance, shown along vertical axis, with respect to a change in frequency of the signal, shown along horizontal axis and measured in hertz (HZ). The transmission line impedance with respect to frequency may be detected, for example, at the input terminal of the measuring instrument electrically connected to the signal source that generates a source signal of varying frequency.

A first curve 302 may be indicative of a change in impedance with respect to frequency at the input terminal of the measuring instrument that does not include the protection circuit 100. A second curve 304 may be indicative of a change in impedance with respect to the frequency at the input terminal of the measuring instrument that includes the protection circuit 100. As illustrated in FIG. 5, the curves 302, 304 indicate a decrease in a difference between the respective impedance values of each of the curves 302, 304 at a given frequency as the frequency values increase. The curves 302, 304, accordingly, indicate that signals having high frequency content, such as signals including frequencies measured in megahertz (MHz) and gigahertz (GHz), may have approximately the same impedance at the input terminal to the measuring instrument whether those signals have travelled through one or more components of the protection circuit 100 or not.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A surge protection system comprising:
surge protection circuitry configured to be electrically connected with a pair of transmission lines between a signal source and an input to an oscilloscope, and including
a pair of series connected diodes in which an anode of one of the diodes shares a first common terminal with a cathode of the other of the diodes, wherein the first common terminal is directly electrically connected to only one of the transmission lines,
a pair of series connected energy absorbing elements, in parallel with the series connected diodes, sharing a second common terminal that is directly electrically connected to only the other of the transmission lines,
a pair of series connected power supplies each configured to reverse bias one of the series connected diodes such that
responsive to a voltage of the signal source being less than a threshold value, the diodes prevent electrical coupling of the energy absorbing elements to the transmission lines, and
responsive to the voltage being greater than the threshold value, the diodes permit electrical coupling of at least one of the energy absorbing elements to the transmission lines via flow of current associated with the voltage first through one of the diodes and then to the at least one of the energy absorbing elements, wherein the at least one of the energy absorbing elements absorbs energy associated with the voltage to limit the voltage to a clamp voltage defined by the at least one of the energy absorbing elements,
a first resistor having a first terminal directly electrically connected with the first common terminal and a second terminal directly electrically connected with the second common terminal; and
a second resistor having a first terminal directly electrically connected between the power supplies such that the first terminal of the second resistor is directly electrically connected with a negative terminal of one of the power supplies and is directly electrically connected with a positive terminal of the other of the power supplies, and a second terminal directly electrically connected with the second common terminal.

2. The surge protection system of claim 1 further comprising a switch electrically connected between the surge protection circuitry and the signal source, and a control circuit configured to command the switch to open responsive to a voltage across the first resistor exceeding a reference value.

3. The surge protection system of claim 1 further comprising a switch electrically connected between the surge protection circuitry and the signal source, and a control circuit configured to command the switch to open responsive to a current exceeding a reference value.

4. The surge protection system of claim 3 further comprising another resistor electrically connected between the switch and resistor.

5. The surge protection system of claim 4, wherein the current is through the another resistor.

6. The surge protection system of claim 1 further comprising a switch and a sensor configured to measure the voltage responsive to the switch being closed.

7. The surge protection system of claim 6, wherein the switch is a relay.

8. The surge protection system of claim 1, wherein the energy absorbing elements are Zener diodes.

9. A surge protection system comprising:
surge protection circuitry configured to be electrically connected with a pair of transmission lines between a signal source and an input to an oscilloscope, and including
a pair of series connected diodes sharing a first common terminal that is directly electrically connected to only one of the transmission lines,
a pair of series connected Zener diodes, in parallel with the series connected diodes, sharing a second common terminal that is directly electrically connected to only the other of the transmission lines,
a pair of series connected power supplies each configured to reverse bias one of the series connected diodes such that (i) the diodes prevent electrical coupling of the Zener diodes to the transmission lines responsive to a voltage of the signal source being less than a threshold value, and (ii) the diodes permit electrical coupling of at least one of the Zener diodes to the transmission lines responsive to the voltage being greater than the threshold value; and
a resistor having a first terminal directly electrically connected between the power supplies such that the first terminal of the resistor is directly electrically connected with a negative terminal of one of the power supplies and is directly electrically connected with a positive terminal of the other of the power supplies, and a second terminal directly electrically connected with the second common terminal.

10. The surge protection system of claim 9 further comprising a second resistor having a first terminal directly electrically connected with the first common terminal and a second terminal directly electrically connected with the second common terminal.

11. The surge protection system of claim 10 further comprising a switch electrically connected between the surge protection circuitry and the signal source, and a control circuit configured to open the switch responsive to a voltage across the second resistor exceeding a reference value.

12. The surge protection system of claim 10 further comprising a switch electrically connected between the surge protection circuitry and the signal source, and a control circuit configured to open the switch responsive to a current exceeding a reference value.

13. The surge protection system of claim 12 further comprising another resistor electrically connected between the switch and second resistor.

14. The surge protection system of claim 13, wherein the current is through the another resistor.

15. The surge protection system of claim 9 further comprising a switch and a sensor configured to measure the voltage responsive to the switch being closed.

16. The surge protection system of claim 15, wherein the switch is a relay.

17. A surge protection system comprising:
surge protection circuitry configured to be electrically connected with a pair of transmission lines between a signal source and an input to an oscilloscope, and including
a pair of series connected diodes sharing a first common terminal that is directly electrically connected to only one of the transmission lines,
a pair of series connected Zener diodes, in parallel with the series connected diodes, sharing a second common terminal that is directly electrically connected to only the other of the transmission lines,
a pair of series connected power supplies each configured to reverse bias one of the series connected diodes such that (i) the diodes prevent electrical coupling of the Zener diodes to the transmission lines responsive to a voltage of the signal source being less than a threshold value, and (ii) the diodes permit electrical coupling of at least one of the Zener diodes to the transmission lines responsive to the voltage being greater than the threshold value,
a resistor having a first terminal directly electrically connected between the power supplies such that the first terminal of the resistor is directly electrically connected with a negative terminal of one of the power supplies and is directly electrically connected with a positive terminal of the other of the power supplies, and a second terminal directly electrically connected with the second common terminal,
a switch electrically connected between the surge protection circuitry and the signal source, and
a control circuit configured to command the switch to open responsive to a measured parameter exceeding a reference value.

18. The surge protection system of claim 17, wherein the measured parameter has units of volts or amps.

* * * * *